United States Patent
Rosen et al.

(10) Patent No.: US 10,605,877 B2
(45) Date of Patent: Mar. 31, 2020

(54) SYSTEM AND METHOD FOR CHEMICAL EXCHANGE SATURATION TRANSFER (CEST) MAGNETIC RESONANCE FINGERPRINTING

(71) Applicant: The General Hospital Corporation, Boston, MA (US)

(72) Inventors: Matthew Rosen, Somerville, MA (US); Christian T. Farrar, Arlington, MA (US); Ouri Cohen, Teaneck, NJ (US); Shuning Huang, College Station, TX (US)

(73) Assignee: The General Hospital Corporation, Boston, MA (US)

( * ) Notice: Subject to any disclaimer, the term of this patent is extended or adjusted under 35 U.S.C. 154(b) by 128 days.

(21) Appl. No.: 15/874,961

(22) Filed: Jan. 19, 2018

(65) Prior Publication Data

US 2018/0210050 A1    Jul. 26, 2018

Related U.S. Application Data

(60) Provisional application No. 62/448,627, filed on Jan. 20, 2017.

(51) Int. Cl.
*G01R 33/50* (2006.01)
*G01R 33/48* (2006.01)
*G01R 33/56* (2006.01)

(52) U.S. Cl.
CPC ......... *G01R 33/50* (2013.01); *G01R 33/4824* (2013.01); *G01R 33/5605* (2013.01); *G01R 33/4804* (2013.01)

(58) Field of Classification Search
CPC .............. G01R 33/50; G01R 33/4824; G01R 33/5605; G01R 33/485; G01R 33/4838; G01R 33/483; G01R 33/4828

(Continued)

(56) References Cited

U.S. PATENT DOCUMENTS

| | | |
|---|---|---|
| 6,943,033 B2 | 9/2005 | Van Zijl et al. |
| 8,369,599 B2 * | 2/2013 | Yarnykh ............ G01R 33/4608 382/131 |

(Continued)

FOREIGN PATENT DOCUMENTS

WO    2015160400    10/2015

OTHER PUBLICATIONS

J. Zhou et al. "Using the Amide Proton Signals of Intracellular Proteins and Peptides to Detect pH Effects in MRI," Nature Medicine, 2003; 9:1085-1090.

*Primary Examiner* — Patrick Assouad
*Assistant Examiner* — Demetrius R Pretlow
(74) *Attorney, Agent, or Firm* — Quarles & Brady LLP

(57) ABSTRACT

A system and method of use includes (a) directing a magnetic resonance (MR) system to perform a pulse sequences block in which radio frequency (RF) energy is applied to the subject to substantially saturate magnetization corresponding to an exchangeable proton. The method includes (b), following step (a), acquiring data from the subject with the MR system and (c) repeating step (a) a plurality of times where parameters of the pulse sequence sub-block differ in at least some pulse sequence sub-blocks by at least an amount of RF energy applied to saturate the magnetization. The method further includes (d), after each repetition of step (a), repeating step (b) to acquire data representing signal evolutions from the subject. Additionally, the method includes (e) comparing the signal evolutions with a dictionary database comprising a plurality of different signal evolution templates to determine quantitative chemical exchange or exchangeable proton information of the subject.

9 Claims, 5 Drawing Sheets

(58) Field of Classification Search
USPC .......................................................... 324/309
See application file for complete search history.

(56) References Cited

U.S. PATENT DOCUMENTS

| | | | |
|---|---|---|---|
| 8,723,518 B2 | 5/2014 | Seiberlich et al. | |
| 10,345,414 B2* | 7/2019 | Gulani | G01R 33/4828 |
| 2008/0200799 A1* | 8/2008 | Willard | A61K 49/124 |
| | | | 600/420 |
| 2012/0019245 A1* | 1/2012 | Reddy | G01R 33/5601 |
| | | | 324/309 |
| 2012/0271159 A1* | 10/2012 | Song | G01R 33/5601 |
| | | | 600/420 |
| 2013/0190601 A1* | 7/2013 | Alsop | G01R 33/5601 |
| | | | 600/410 |
| 2014/0070803 A1* | 3/2014 | Jin | G01R 33/5605 |
| | | | 324/309 |
| 2014/0167754 A1* | 6/2014 | Jerecic | G01R 33/561 |
| | | | 324/309 |
| 2014/0213887 A1* | 7/2014 | Reddy | G01R 33/5605 |
| | | | 600/414 |
| 2014/0218027 A1* | 8/2014 | Fautz | G01R 33/4836 |
| | | | 324/309 |
| 2015/0297101 A1* | 10/2015 | Hernandez-Garcia | G01R 33/56563 |
| | | | 600/419 |
| 2015/0301141 A1 | 10/2015 | Griswold et al. | |
| 2015/0323632 A1* | 11/2015 | Sun | G01R 33/483 |
| | | | 324/309 |
| 2016/0025835 A1* | 1/2016 | Gulani | G01R 33/5635 |
| | | | 600/420 |
| 2016/0116559 A1* | 4/2016 | Cohen | G01R 33/561 |
| | | | 324/309 |
| 2016/0187445 A1* | 6/2016 | McMahon | G01R 33/5605 |
| | | | 600/420 |
| 2016/0228581 A1* | 8/2016 | Morrow | A61K 49/106 |
| 2016/0349339 A1* | 12/2016 | Brady-Kalnay | G01R 33/50 |
| 2017/0227619 A1* | 8/2017 | Reddy | G01R 33/5601 |
| 2017/0293005 A1* | 10/2017 | Panther | A61B 5/05 |
| 2017/0315193 A1* | 11/2017 | Amthor | A61B 5/055 |
| 2018/0217220 A1* | 8/2018 | Gulani | G01R 33/5659 |
| 2018/0237741 A1* | 8/2018 | Gazit | B01L 3/5027 |
| 2018/0313925 A1* | 11/2018 | Parker | G01R 33/5619 |
| 2019/0033412 A1* | 1/2019 | Alsop | G01R 33/5608 |

* cited by examiner

SYSTEM AND METHOD FOR CHEMICAL EXCHANGE SATURATION TRANSFER (CEST) MAGNETIC RESONANCE FINGERPRINTING

CROSS-REFERENCE TO RELATED APPLICATIONS

The present disclosure is based on, claims priority to, and incorporates herein by reference in its entirety U.S. Provisional Application Ser. No. 62/448,627, filed Jan. 20, 2017, and entitled, "CHEMICAL EXCHANGE SATURATION TRANSFER (CEST) MAGNETIC RESONANCE FINGERPRINTING."

STATEMENT REGARDING FEDERALLY SPONSORED RESEARCH

This invention was made with government support under Ca203873-01 awarded by National Institutes of Health. The government has certain rights in the invention.

BACKGROUND

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

MRI can be used to measure the exchange of magnetization between molecules to provide unique information about the chemical and molecular environment of samples or tissues. One type of such exchange measurement is broadly referred to in the field as magnetization transfer. This technique is capable of measuring the exchange of magnetization from spin species that have short transverse relaxation times ($T_2$). Because many different molecules have short $T_2$, this technique is not particularly specific.

A second type of magnetization exchange occurs between water protons and a molecule with long enough $T_2$ that its difference in frequency from water can be observed. Saturation of the magnetization from this molecule will generally decrease the measurable signal from water. This effect is generally referred to in the field as chemical exchange saturation transfer ("CEST"). Two different types of molecules can generate CEST effects: endogenous, or naturally occurring, molecules and exogenous contrast agents. In either instance, the molecules whose chemical exchange with water produces the CEST effect are generally referred to as a so-called "exchangeable protons."

The CEST imaging method offers three advantages over traditional molecular MRI techniques. First, in some cases the molecules of interest within the subject can be directly detected. This feature mitigates the need for administering contrast agents to the subject. Second, the image contrast mechanism can be controlled with the RF pulses produced by the MRI system and, as such, can be turned on and off when desired. This control allows the location of specific molecules of interest to be detected by comparing images having the desired contrast present to those where it has been turned off.

A number of different molecular groups have been suggested for CEST studies. One such group are the amide protons. Amide protons are present in large numbers on peptides and proteins; therefore, amide proton CEST should be reflective of protein concentration in cells. However, other exchangeable protons are also targeted with CEST imaging methods. Exemplary exchangeable protons include those protons contained in hydroxyl and glycogen, as well as paramagnetic molecules in general.

However, CEST MRI suffers from several limitations including long image acquisition times and the qualitative nature of the CEST contrast, which depends on many factors, including the chemical exchange rate, concentration of exchangeable protons, longitudinal relaxation time, and RF saturation power.

It would therefore be desirable to provide a system and method to rapidly and quantitatively assess subjects non-invasively.

SUMMARY OF THE PRESENT DISCLOSURE

The present disclosure overcomes the aforementioned drawbacks by providing systems and methods for performing rapid and quantitative measurements of tissue using CEST-based MRI techniques. More particularly, a magnetic resonance fingerprinting ("MRF") technique is provided for generating quantitative exchange rate and exchangeable proton concentration maps.

DETAILED DESCRIPTION OF THE PRESENT DISCLOSURE

Figure 1A:
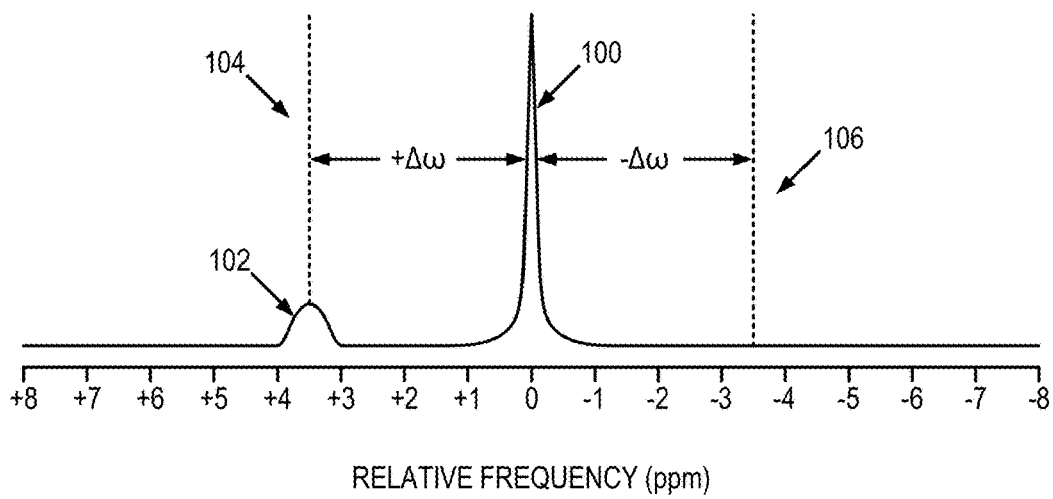
FIG. 1A is a graphic illustrations of an exemplary frequency spectrum that includes a water proton resonance peak and an amide proton resonance peak.

As described, measuring the exchange of magnetization between molecules with nuclear magnetic resonance can provide unique information about the chemical and molecular environment of samples or tissues. CEST imaging renders MRI, which usually detects only bulk water signal, sensitive to metabolites and their byproducts, such as glucose and lactate. In particular, the chemical exchange between bulk water and amide protons from endogenous proteins and peptides has been shown to be sensitive to ischemic tissue acidosis, and as a result has given rise to an imaging technique referred to as amide proton transfer (APT) imaging. Since tissue pH decreases in response to abnormal glucose/oxygen metabolism during acute ischemia, pH-sensitive APT imaging may serve as a surrogate metabolic imaging marker for stroke. In that it complements perfusion and diffusion MRI, APT imaging may allow better characterization of penumbra for predicting ischemic tissue outcome in acute stroke. Moreover, APT imaging may eventually help guide thrombolytic and/or neuroprotective therapies for acute stroke.

Unfortunately, CEST and APT imaging techniques are limited to acquiring single slices of image data. This limitation is largely a factor of the very long continuous wave ("CW") RF irradiation, typically a few seconds, required to reach the steady state for quantitative APT imaging. CEST and APT imaging methods typically require lipid suppression techniques, which often take tens of milliseconds. As a result, multi-slice imaging techniques suffer from decreased CEST contrast as a result of longitudinal relaxation during preparation and image acquisition. Additionally, repeating RF irradiation for each slice is a very time-consuming procedure, and thus not feasible for in vivo applications. One potential alternative is to use a concatenated short irradiation RF pulse and image readout for each k-space line, similar to methods used in conventional magnetization transfer (MT) imaging. However, the saturation frequency bandwidth for short RF irradiation pulses can be very large and, as such, they may reduce the pH-specificity of APT imaging by introducing concomitant direct RF saturation (spillover) and conventional macromolecular MT effects. Moreover, given that the endogenous in vivo APT contrast is only about 3%, multiple signal averaging is often necessary to enhance the contrast-to-noise ratio (CNR), which requires the duration for each APT scan to be minimized.

A number of different molecular groups have been suggested for CEST studies. One such group includes the amide protons. Amide protons are present in large numbers on peptides and proteins; therefore, amide proton CEST should be reflective of protein concentration in cells. However, other exchangeable protons are also targeted with CEST imaging methods. Exemplary exchangeable protons include those protons contained in hydroxyl and glycogen, as well as paramagnetic molecules in general.

The size of the CEST effect is determined by how quickly the protons exchange their magnetization with water. This exchange rate is believed to be determined by pH, so the CEST effect can also potentially provide information indicative of altered pH levels. Conventional amide proton CEST imaging methods are described, for example, by J. Zhou, et al., in "Using the Amide Proton Signals of Intracellular Proteins and Peptides to Detect pH Effects in MRI," Nature Medicine, 2003; 9:1085-1090, and in U.S. Pat. No. 6,943,033. Imaging using amide proton transfer contrast has a number of potential applications. For example, low pH is indicative of ischemia and could be used in imaging of stroke and other ischemic diseases.

For amide proton CEST, and many other endogenous CEST applications, a major difficulty arises when attempting to avoid other sources of signal change when saturation of the labile proton line is performed. For example, off-resonance saturation can cause direct saturation of the nearby water line, as well as magnetization transfer effects resulting in saturation of broad molecular lines that exchange magnetization with water.

CEST experiments rely on the difference in CEST effect with the frequency of application. One common imaging approach is to compare an image with saturation applied at the frequency of the molecule of interest with another where the saturation is applied on the opposite side of the water frequency that is applied at the negative of the first frequency. This is successful only if the position of the water line is known exactly and if the magnetization transfer effect is symmetric around the water line. While these situations might be achievable in vitro, neither are present in vivo, thereby resulting in significant errors when utilizing the aforementioned approach.

An alternative is to perform CEST studies at many frequencies and fit the signal as a function of frequency to some model. In addition the fact that the appropriate model is typically not known, the long acquisition time needed to acquire images over many frequencies is a disadvantage. Even with the acquisition of many data points, amide proton CEST in normal tissue is very difficult to measure. CEST, and specifically amide proton transfer CEST, is not currently used in diagnostic applications due to the foregoing difficulties with the imaging method.

As noted above, the CEST imaging method is built upon the method of conventional magnetization transfer. The contrast mechanism of CEST imaging allows for the detection of exchangeable proteins and peptides. This is achieved by the selective irradiation of labile protons, which in turn attenuate the bulk water signal through saturation transfer. Labile protons are saturated using either an off-resonance pulse or continuous wave of RF irradiation. This saturation process is known as "RF labeling" or simply "labeling".

Because chemical exchange is often dependent on pH, CEST imaging methods can be sensitive to microenvironment pH. A specific variant of CEST imaging methods, referred to as APT MRI, utilizes labile amide protons from endogenous proteins and peptides to provide the CEST contrast mechanism.

It will be appreciated by those skilled in the art that the herein described method is applicable not only to amide proton CEST, but also for CEST imaging techniques that utilize other molecular targets, such as glycogen ("glycoCEST"), hydroxyl proton CEST ("OH CEST"), and paramagnetic molecule CEST ("paraCEST"). The term "exchangeable proton" herein refers to those proton or other molecular targets from which magnetization or saturation is desired to transfer to water protons during a CEST imaging scan.

It is well known in the art that the spin state of so-called "exchangeable" protons, such as amide protons, can be utilized to influence the spins state of water protons through exchange processes. The exchangeable protons can be saturated by applying RF energy thereto. Such saturation is also referred to as labeling the exchangeable protons. The saturation of the exchangeable protons is subsequently transferred to the water protons, depending upon the rate of exchange between the two spin populations, and hence is detectable with MRI. It is the transfer of this saturation through chemical exchanges between the exchangeable and water protons that forms the basis of CEST imaging methods.

Figure 1B:
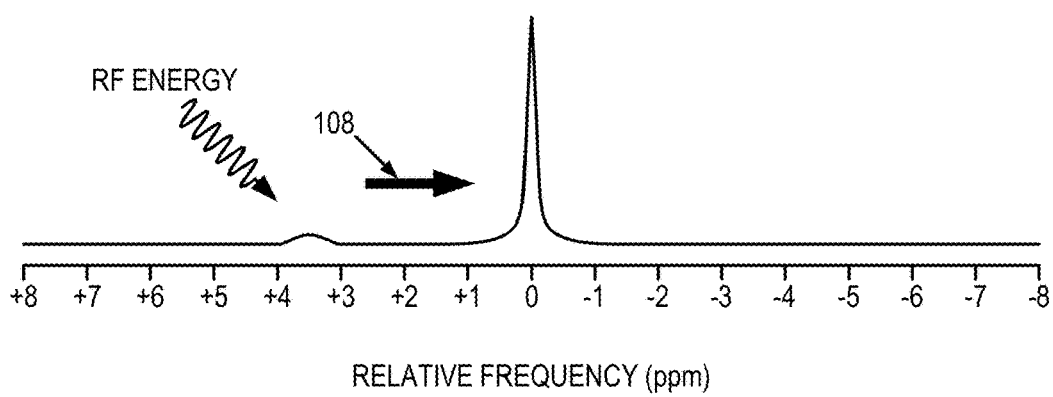
FIG. 1B is a graphic illustration of the effect of the application of radio frequency ("RF") energy at a labeling frequency that is around the resonance frequency of an exchangeable proton, such as an amide proton, on detectable signal from water protons adjacent the exchangeable proton.
Figure 1C:
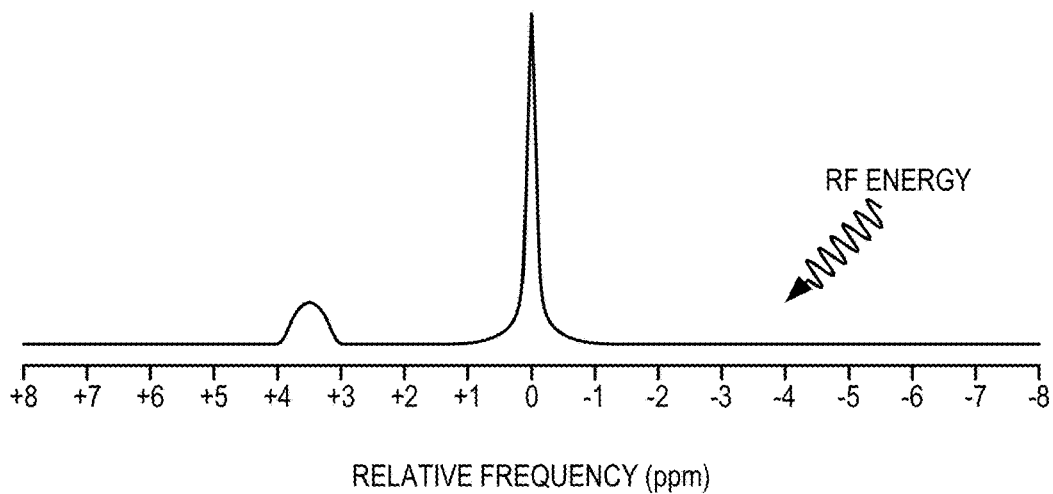
FIG. 1C is a graphic illustration of the effect of the application of RF energy at a reference frequency, equal to the negative of the labeling frequency, on detectable signal from water protons adjacent the exchangeable proton.

Referring now to FIGS. 1A-1C, a graphic illustration of an exemplary method for producing CEST contrast is shown. An exemplary spectrum is illustrated in FIG. 1A, the spectrum including a spectral peak 100 corresponding to water protons and a spectral peak 102 corresponding to amide protons. The amide proton peak 102 exists at a frequency shift relative to the water peak 100. For example, there is a frequency shift of around +3.5 parts per million ("ppm") between the water peak 100 and the amide proton peak 102. Thus, a so-called "labeling spectral line" 104, or "labeling frequency," is centered at or around the resonance frequency of the exchangeable proton, which for an amide proton is shifted about +3.5 ppm relative to the water peak 100. In general, for CEST imaging, the labeling spectral line is selected as a frequency at or around the resonance frequency of the exchangeable proton. A so-called "reference spectral line" 106, or "reference frequency," also exists, and is equal to the negative of the labeling frequency relative to the water peak 100. In the alternative, the labeling and reference frequencies may also be mirrored about the magnetization transfer spectrum.

A first set of image data is acquired with an MRI system by applying RF energy at the labeling spectral line 104, such that the amide proton spins are saturated. In turn, the saturation of the amide protons is transferred through chemical exchange processes to nearby water protons, as indicated by line 108 in FIG. 1B. As a result, the detectable signal from these water protons is reduced. In this manner, a so-called "labeled image data set" is acquired. Referring now to FIG. 1C, a second set of image data is then acquired with the MRI system by applying RF energy at the reference spectral line 106. As this irradiation produces no saturation in the amide proton spins, there is no saturation transferred to the adjacent water spins and, therefore, no resultant decrease in detectable signal. Accordingly, such image data is referred to as "reference image data." An image indicative of the CEST contrast mechanism is thereby produced by subtracting an image reconstructed from the labeled image data set from an image reconstructed from the reference image data set.

The following definitions and terms are provided to better define the present invention and to guide those of ordinary skill in the art in the practice of the present invention:

$k_{ws}$ is the chemical exchange rate from bulk water to the labile proton pool;

$k_{sw}$ is the chemical exchange rate from the labile proton pool to bulk water;

$R_{1w}$ is the longitudinal relaxation rate of bulk water;

$R_{1s}$ is the longitudinal relaxation rate of the labile proton pool;

$R_{2w}$ is the transverse relaxation rate of bulk water;

$R_{2s}$ is the transverse relaxation rate of the labile proton pool;

$r_{1w}=R_{1w}+k_{ws}$ is a term that describes the effects of longitudinal relaxation and chemical exchange on bulk water;

$r_{1s}=R_{1w}+k_{sw}$ is a term that describes the effects of longitudinal relaxation and chemical exchange on the labile proton pool;

$r_{2w}=R_{2w}+k_{ws}$ is a term that describes the effects of transverse relaxation and chemical exchange on bulk water; and $r_{2s}=R_{2s}+k_{sw}$ is a term that describes the effects of transverse relaxation and chemical exchange on the labile proton pool.

CEST imaging is often described using a simple 2-pool chemical exchange model, with the magnetizations for labile protons and bulk water described by two distinct sets of Bloch equations that are coupled by chemical exchange. In this model, the bulk water Bloch equation is given by:

$$\frac{dM_{zw}}{dt} = -r_{1w}(M_{zw} - M_{0w}) + k_{sw}(M_{zs} - M_{0s}); \tag{7}$$

where $M_{zw}$, $M_{zs}$, $M_{zw}$, and $M_{0s}$ are the transient and equilibrium z-magnetizations for the bulk water and labile proton pools, respectively. Likewise, the labile proton Bloch equation is given by:

$$\frac{dM_{zs}}{dt} = -r_{1s}(M_{zs} - M_{0s}) + k_{ws}(M_{zw} - M_{0w}); \tag{8}$$

After RF irradiation, coupling between the bulk water and labile proton groups cause their respective magnetizations to recover towards their equilibrium states in accordance with the above physical model. If the spillover effects are negligible the z-magnetization for the bulk water pool can determined by:

$$M_{zw}(t) = \qquad (9)$$
$$M_{0w}\left\{1 - \left[\frac{(r_{1s} - r_{1w})A + 2k_{sw}f\alpha}{\sqrt{B}}\sinh\left(\frac{\sqrt{B}}{2}t\right) + A\cosh\left(\frac{\sqrt{B}}{2}t\right)\right]e^{-\left(\frac{r_{1w}+r_{1s}}{2}\right)t}\right\};$$

where: $A = \alpha \cdot \frac{k_{ws}}{r_{1w}}$; $B = (r_{1s} - r_{1w})^2 + 4k_{sw}k_{ws}$;

and

α is a labeling coefficient, which for slow to intermediate chemical exchange has the form:

$$\alpha = \frac{\omega_1^2}{p \cdot q + \omega_1^2}; \text{ where: } p = r_{2s} - \frac{k_{sw}k_{ws}}{r_{2w}}; q = r_{1s} - \frac{k_{sw}k_{ws}}{r_{1w}};$$

and $\omega_1$ is the RF irradiation power.

Additionally, $f$ is the proton ratio between bulk water and the labile proton and t is the duration between the end of the RF irradiation and the echo time. Generally, data from a reference scan is acquired before a label scan, in which saturation of the labile proton group occurs. For the reference scan, the irradiation pulse is applied at a reference frequency that is symmetric around the bulk water resonance frequency and opposite to the labile proton frequency. As a result, the labeling coefficient, α, is minimal and the z-magnetization of the bulk water is given by:

$$M_{zw}(t) = M_{0w}, \qquad (10);$$

A parameter called the CEST ratio (CESTR) can be derived by taking the difference between the reference and label scans, and normalized by a control signal without RF irradiation as:

$$CESTR(t) = \qquad (11)$$
$$\frac{k_{ws}}{r_{1w}} \cdot \alpha \cdot \left[\frac{(r_{1s}+r_{1w})}{(r_{1s}-r_{1w})}\frac{e^{\left(-r_{1w}+\frac{k_{sw}}{r_{1s}-r_{1w}}k_{ws}\right)t} - e^{-\left(r_{1s}+\frac{k_{sw}}{r_{1s}-r_{1w}}k_{ws}\right)t}}{2} + \frac{e^{\left(-r_{1w}+\frac{k_{sw}}{r_{1s}-r_{1w}}k_{ws}\right)t} + e^{-\left(r_{1s}+\frac{k_{sw}}{r_{1s}-r_{1w}}k_{ws}\right)t}}{2}\right];$$

When the labile proton group is dilute, the proton ratio, $f$, has the form:

$$f = \frac{k_{ws}}{k_{sw}} \approx \frac{r_{1w}}{r_{1s}} \ll 1; \qquad (12)$$

and as such, CESTR can be further simplified as:

$$CESTR(t) = \frac{k_{ws}}{r_{1w}} \cdot \alpha \cdot e^{\left(-r_{1w}+\frac{k_{sw}}{r_{1s}-r_{1w}}k_{ws}\right)t}; \qquad (13)$$

In addition, for dilute labile protons, $$\frac{k_{sw}}{r_{1s}-r_{1w}} \approx 1.$$

Therefore, CESTR can be even further simplified to:

$$CESTR(t) = \frac{k_{ws}}{r_{1w}} \cdot \alpha \cdot e^{-R_{1w}t}; \qquad (14)$$

As will be described, CEST magnetic resonance fingerprinting ("MRF") uses selective radio-frequency pulses to detect exchangeable protons on a variety of molecules including proteins and has been shown to be a powerful new tool for imaging different disease states. For example, the amide proton CEST contrast from endogenous proteins has recently been used to distinguish tumor recurrence from radiation necrosis and to detect changes in pH during stroke. In addition, a number of diaCEST pH imaging probes are under clinical evaluation for monitoring tumor acidosis and detecting acute kidney injury. However, traditional CEST MRI suffers from several limitations including long imaging acquisition times and qualitative nature of the CEST contrast, which depends on many factors, including the chemical exchange rate, concentration of exchangeable protons, longitudinal relaxation time, and RF saturation power.

Systems and methods are described herein for generating quantitative parameters associated with CEST, such as chemical exchange rate and exchangeable proton volume fraction, using MRF techniques. In particular, the systems and methods described here can be used to generate quantitative chemical exchange rate and exchangeable proton volume fraction maps. Quantitative maps of the chemical exchange rate, volume fraction of the exchangeable proton pool, $T_1$ and $T_2$ relaxation rates, and $B_0$ field maps can be simultaneously obtained using the systems and methods described herein. CEST-MRF can be performed with very short acquisition times and can be used in combination with respiratory or cardiac gating strategies.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. The acquisition parameters can be varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

MRF can be conceptualized as employing a series of varied "sub-blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when RF energy is applied to a volume that has both bone and muscle tissue, then both the bone and muscle tissue will produce an NMR signal. However the "bone signal" represents a first resonant species and the "muscle signal" represents a second resonant species and the two will be different. These different signals from different species can be collected simultaneously over a period of time to collect an overall "signal evolution" for the volume.

The random or pseudorandom measurements obtained in MRF techniques are achieved by varying the acquisition parameters from one repetition time (TR) period to the next, which creates a time series of signals with varying contrast. Examples of acquisition parameters that can be varied include flip angle (FA), radio frequency (RF) pulse phase, TR, echo time (TE), saturation pulse power, saturation pulse length, saturation pulse frequency offset, and sampling patterns, such as by modifying one or more readout encoding gradients.

From these random or pseudorandom measurements, MRF processes can be designed to map any of a wide variety of parameters, such as longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques is compared with a dictionary of signal models, or templates, that have been generated for different acquisition parameters from magnetic resonance signal models, such as Bloch equation-based physics simulations. This comparison allows estimation of the physical parameters, such as those mentioned above. The parameters for the tissue or other material in a given voxel are estimated to be the values that provide the best signal template matching.

In the systems and methods described here, an optimized schedule of acquisition parameters (e.g., FA, TR, TE, saturation power, saturation pulse offset, saturation pulse length,) is generated based on the physical, quantitative parameters to be estimated (e.g., relaxation parameters, parameters associated with CEST). This optimization can be used to maximize discrimination between signal magnetization from different tissues, and in turn appreciably reduce the number of measurements required to produce quantitative or CEST parameters and the corresponding quantitative maps. As used herein CEST acquisition parameters may reflect a subset of general acquisition parameters and include saturation characteristics (saturation power), excitation frequencies or timings, or other characteristics that are utilized to elicit information yielding CEST data.

Figure 2A:
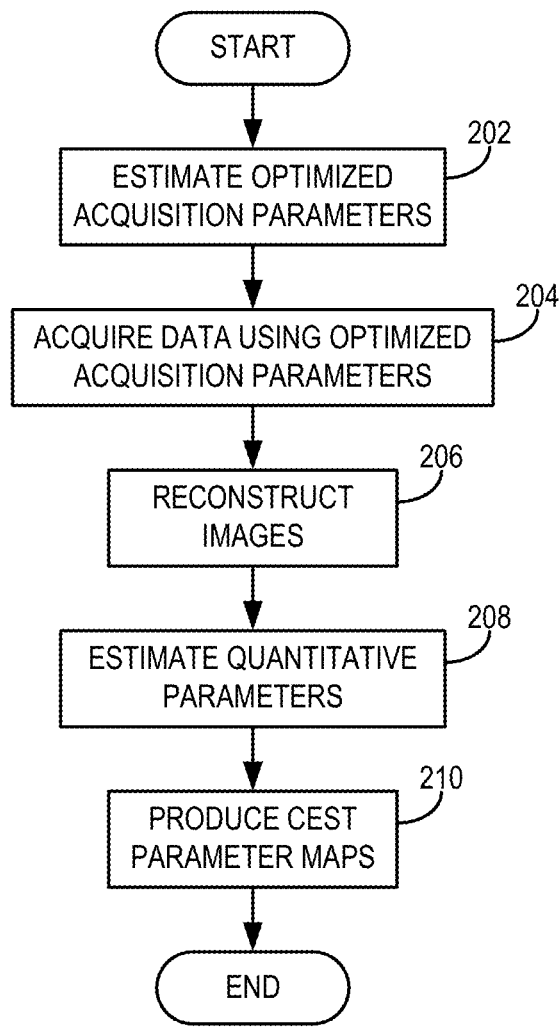
FIG. 2A is a flowchart setting forth the steps of an example of a method for quantitative chemical exchange saturation transfer ("CEST") imaging using magnetic resonance fingerprinting ("MRF") techniques in accordance with the present disclosure.

Referring now to FIG. 2A, a flowchart is provided that sets forth some example steps of one non-limiting method for producing a quantitative map from data acquired using acquisition parameters that have been selected to reduce the number of acquisitions necessary to desirably sample the physical parameter space. The method begins by generating a vector, or schedule, of acquisition parameters that has been selected (or, as a non-limiting example, optimized) to reduce the number of acquisitions necessary to sufficiently sample the parameter space, as indicated at step 202. Also, CEST-MRF can be used to generate fast and quantitative pH maps using exogenous CEST contrast agents such as iopamidol. In such case, step 202 may include the delivery of a contrast agent, such as iopamidol or other contrast agent to the subject prior to commencing data acquisition.

By way of example, the selection or optimization of acquisition parameters, such as FA and TR, as well as CEST-specific parameters such as saturation pulse parameters (e.g., $f_{offsets}$), may include providing an initial seed vector which may be randomly generated of the acquisition parameters to be selected or optimized. This seed vector may have a length, N, and may be used to simulate the signal for a range, P, of parameters. The seed vector and simulated parameters are used to form an N×P matrix, A. This matrix, A, can then be used to calculate a dot product matrix, $$D = A^T A \qquad (1).$$

The diagonal elements of this dot product matrix, D, indicate the closeness of a match between a schedule resulting from a given physical parameter (e.g., $T_1$, $T_2$) and itself. The diagonal elements are, therefore, equal to one. The off-diagonal elements of the dot product matrix, D, however, indicate the quality of matching between every two different elements of the matrix, A. Discriminating between tissue and CEST parameters in the matching process requires that the pattern match (e.g. dot product) of a measured trajectory with the pre-computed trajectory that is stored in the dictionary be high for the correct tissue and CEST parameters values and, ideally, zero for all others. To find the vector of acquisition parameters (e.g., TRs, FAs, saturation power) that yield this optimum value, or a value that is otherwise sufficiently desirable, a model can be utilized. One non-limiting example of a model is the following optimization problem:

$$\min_x f(x) \text{ such that } \sum_{i \neq j} D_{ij}(x) - \lambda \sum_{i=j} D_{ij}(x); \qquad (2)$$

where $f(x)$ is the function to simulate the schedule and compute the dot product matrix, D, given a vector, x, of acquisition parameters. A penalty term, $\lambda$, is applied as well to avoid minimizing the on-diagonal elements. Another non-limiting example of a model that can be used is:

$$\min_x f(x) = \frac{\sum_{i \neq j} D_{ij}(x)}{\sum_{i=j} D_{ij}(x)}; \qquad (3)$$

where the ratio of off-diagonal to diagonal elements is minimized. As one example, a constrained non-linear solver can be used to solve Eqns. (2) or (3).

However, the present disclosure also recognizes that using the dot product to find the vector of acquisition parameters (e.g., TRs, FAs, saturation power, and the like) that yield this optimum value can have some drawbacks. For example, there can be poor discrimination of exchange rate and concentration for "low" concentrations. Also, normalizing by norm can scale out large differences in CEST effect between samples. That is, for CEST, the dependence of the trajectory on the prior history is not great. Thus, normalizing by the norm, which is performed for dot product matching can cause some of the desired differences between trajectories to be normalized out with different exchange rates/concentrations. Thus, a subtraction match of unnormalized trajectories may be used instead of the dot product match to improve the discrimination.

In particular, a subtraction correlation matrix, S, may be used, which is given by:

$$S_{ij} = \frac{1}{1 + \sum_N (d_i - d_j)}; \qquad (4)$$

where N is the number of points in a trajectory as incremented through i and j and d is the signal intensity trajectory for a given dictionary set of parameters. When using a subtraction dictionary correlation, it is desirable to incorporate $M_0$, the equilibrium magnetization, into the dictionary for matching unnormalized trajectories.

Using the optimized schedule reduces the total number of acquisitions needed to sufficiently sample the physical parameter space, but also samples this physical parameter space in a manner that increases the discrimination between different parameters, thereby reducing the scan time required to perform MRF. Additional time savings can be achieved by using rapid data acquisition schemes, such as echo planar imaging ("EPI") and segmented EPI.

Figure 2B:
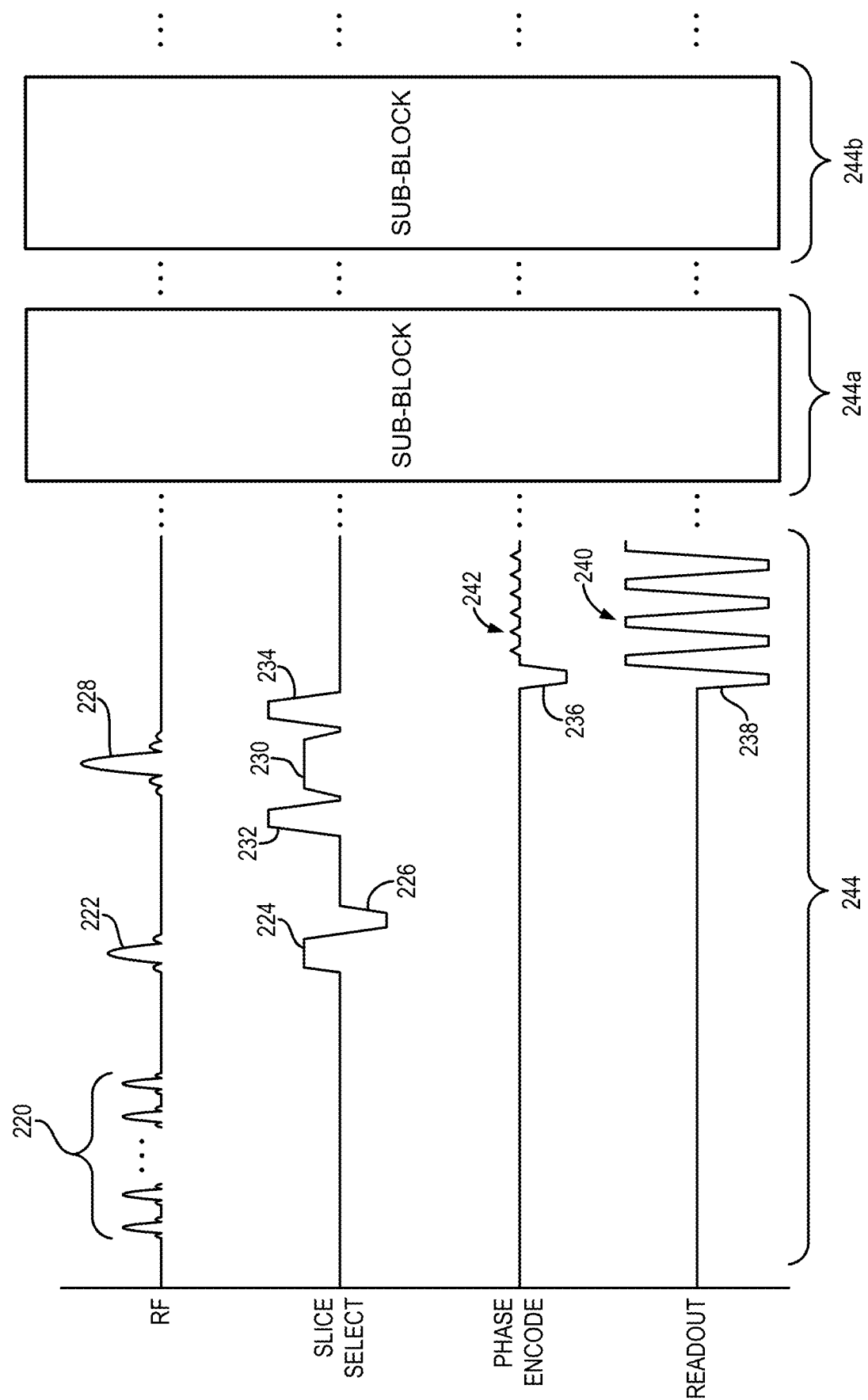
FIG. 2B is an example of a pulse sequence diagram showing a plurality of sub-blocks that can be used to implement a CEST-MRF technique in accordance with the present the present disclosure.

Referring again to FIG. 2A, the method for estimating CEST parameters continues by acquiring data by directing an MRI system to perform pulse sequences, as indicated at step 204. The pulse sequences can include any suitable pulse sequence for obtaining CEST data. Referring now to FIG. 2B, one example of a pulse sequence for a CEST acquisition is illustrated. The pulse sequence begins with the application of a saturation radio frequency ("RF") pulse train 220. The saturation pulse train 220 may include a series of RF pulses that are applied at a selected off-resonance frequency in order to "label" the exchangeable proton pool spins, or the saturation pulse train 220 may include a continuous RF wave. Following the application of the saturation pulse train 220, data acquisition occurs.

By way of example, data acquisition can be achieved using a spin-echo, echo planar imaging ("EPI") method; however, it will be appreciated by those skilled in the art that other methods can be employed to perform data acquisition, such as rapid acquisition with refocused echoes ("RARE") and other fast spin echo ("FSE") based methods. First, an RF excitation pulse 222 is played out in the presence of a slice selective gradient 224. To mitigate signal losses resulting from phase dispersions produced by the slice selective gradient 224, a rephasing lobe 226 is applied after the slice selective gradient 224. Next, a rephasing RF pulse 228 is applied in the presence of another slice selective gradient 230. In order to substantially reduce unwanted phase dispersions, a first crusher gradient 232 bridges the slice selective gradient 230 with a second crusher gradient 234. A pre-phaser gradient waveform 236 is then applied in the phase encoding direction, as is a pre-phaser pulse 238 in the readout direction. Both of the pre-phaser pulses, 236 and 238, are followed by the application of an alternating readout gradient pulse train 240. A spin-echo MR signal is acquired during each positive and negative pulse peak of the readout pulse train 320, and a phase-encoding gradient "blip" 242 is applied between each readout pulse peak to separately phase encode each acquired echo signal. The data acquisition is repeated a plurality of times with a different first slice selective gradient 224 and second slice selective gradient 230 applied during each repetition such that multiple slices of image data are acquired.

As illustrated by bracket 244, the above-described pulse sequence may represent a sub-block and multiple sub-blocks can be performed in each acquisition, wherein acquisition parameter values for each sub-block can vary from one repetition to the next. That is, a sub-block includes one or more excitation phases, one or more readout phases, and one or more waiting phases, to cause one or more resonant species to produce individual NMR signals. For example, saturation power used in the saturation RF pulse train 220 and experiment repetition time (TR) may be varied, for example, randomly or pseudo-randomly with each different iteration of the sub-block 244, 244a, 244b, and so on. That is, the power of the saturation pulses in the saturation RF pulse train 220 as well as the time between repetitions of sub-blocks 244, 244A, 244b, and so on may vary between sub-blocks 244, 244A, 244b, and so on. These are, however, non-limiting examples of acquisition parameters that can be varied in accordance with a CEST-MRF imaging process in accordance with the present disclosure.

As an MRF sequence, at least one member of the series of variable sub-blocks differs from at least one other member of the series of variable sub-blocks in a given series including sub-blocks. In some aspects, TR, FA, saturation power, saturation duration, number of saturation pulses and other acquisition parameter values may be varied in accordance with optimized or desired trajectories, such as those described above. The parameters can be varied sequentially, simultaneously, or in accordance with a differential sensitivity requirement for specific parameters of interest to create the variation desired between sub-blocks to achieve varied or even random or pseudorandom signal evolutions.

Reports can be reconstructed from the signal evolutions acquired by the acquisitions spanning the multiple sub-blocks. As indicated at step 206, images can be reconstructed from the acquired data and CEST parameter maps can then be estimated by comparing reconstructed images to a pre-computed dictionary, as indicated at step 208. Conventional matching algorithms can be used to achieve this comparison; however, in some configurations, an adaptive matching algorithm, such as the one described in co-pending PCT Application No. PCT/US15/11948, which is herein incorporated by reference in its entirety, can also be used. The quantitative parameters determined at step 208 through such comparison/matching against the dictionary can then be used to produce CEST parameter maps at step 210, which can indicate CEST parameters spatially aligned with anatomical information, or the like.

An MRF dictionary for CEST MRF may be built, for example, Bloch simulations providing signal evolutions relative to a saturation power schedule (saturation power vs. trajectory points), z-spectrum schedule (saturation frequency offset vs. trajectory points), or normalized signal intensity across the image series. However, these are only a few examples and other parameters or means of creating dictionaries are contemplated.

In one non-limiting example, an EPI pulse sequence was used to acquire CEST data using a 9.4 T Bruker MRI scanner from CEST phantom having 6 tubes of 10, 25, and 50 mM L-Arginine (L-Arg) at pH 4 and 5, as shown in FIG. 2B. The exchange rates of the amide exchangeable protons, resonating at +3 ppm chemical shift from the water protons, were measured using a quantifying exchange using saturation power (QUESP) MRI method. The saturation pulse of the EPI pulse sequence was kept fixed at +3 ppm offset from water and the saturation power and experiment repetition time were varied randomly for 100 different iterations with a total acquisition time of 6 minutes. The variation in CEST-MRF signal intensity with iteration number was then fit to a large dictionary of simulated signal trajectories for different exchange rates (100-1500 Hz) and L-Arg concentrations (1-150 mM).

Figure 4A:
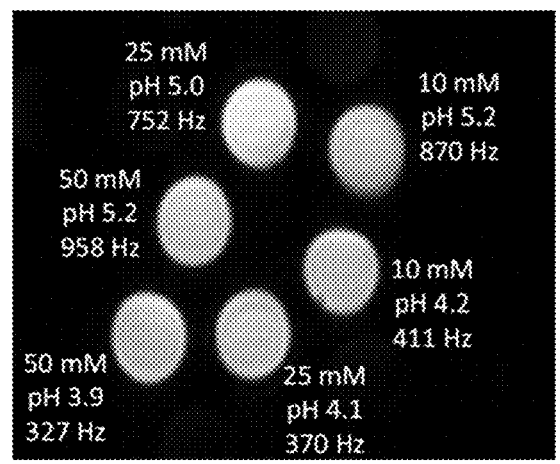
FIG. 4A is an image of a CEST phantom produced without using a saturation pulse and using a quantifying exchange using saturation power (QUESP) MRI technique to measure exchange rates for each sample.
Figure 4B:
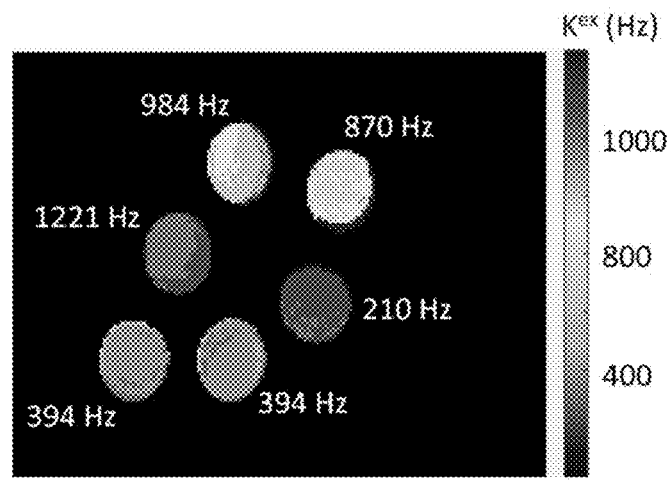
FIG. 4B is an image of a CEST phantom produced using a CEST-MRF technique in accordance with the present disclosure showing amide proton chemical exchange rate ($k_{ex}$).
Figure 4C:
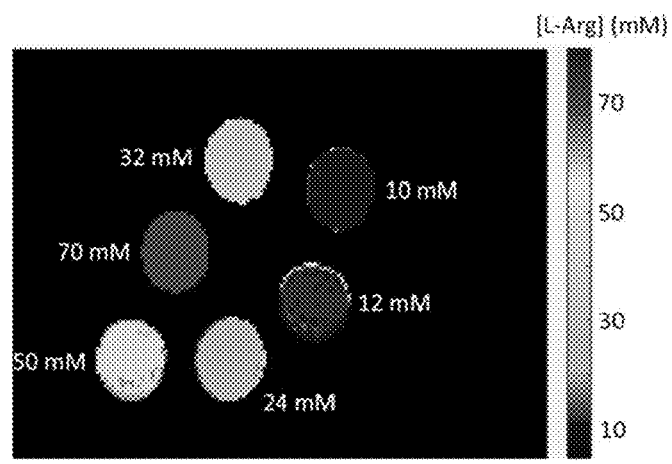
FIG. 4C is an image of a CEST phantom produced using a CEST-MRF technique in accordance with the present disclosure showing L-Arginine concentration maps of the CEST phantom.

Using the process described above with respect to FIG. 2A, CEST fingerprinting maps were produced that accurately quantified the L-Arg concentration (FIG. 4C) for all samples except for the 50 mM pH 5.2 sample. The results showed good agreement between the images produced using QUESP (FIG. 4A) and those produced using CEST-MRF (FIG. 4B) measured exchange rates. Discrepancies are likely due to the use of a non-optimized MRF trajectory and uncertainties in the QUESP measured exchange rates themselves.

Thus, the above-described CEST-MRF technique provides a method for fast, quantitative CEST imaging. Additional optimization of the CEST-MRF trajectory can be performed to improve discrimination of exchange rates and concentrations and enable the use of a decreased number of fingerprinting iterations, thereby further decreasing the image acquisition time.

Thus, as described, CEST-MRF is provided and can be used to generate quantitative chemical exchange rate and exchangeable proton volume fraction maps. Quantitative maps of the chemical exchange rate, volume fraction of the exchangeable proton pool, $T_1$ and $T_2$ relaxation rates, and $B_0$ field maps can be simultaneously obtained. Furthermore, CEST-MRF can be performed with very short acquisition times and can be used in combination with respiratory or cardiac gating strategies.

As stated, CEST-MRF can be used to measure the amide proton chemical exchange rate, which is sensitive to pH. CEST-MRF can therefore be used to characterize tissue pH, which is altered in numerous disease states such as tumors and stroke. CEST-MRF can also be used to measure the concentration of the mobile protein pool in tissues. Alterations in protein concentrations occur in rapidly dividing tumor cells and can therefore be used to assess tumor growth and response to tumor therapies.

CEST-MRF can also be used to image CEST reporters proteins. Different reporter proteins with different labile proton chemical exchange rates can be distinguished by quantitative measurements of their exchange rates and their concentrations can be quantified by the volume fraction of the exchangeable proton pool. Reporter genes encoding these reporter proteins can be engineered into biological therapeutics such as oncolytic viruses and cell based therapies. CEST-MRF enables the in vivo imaging of such biological therapeutics.

Figure 3:
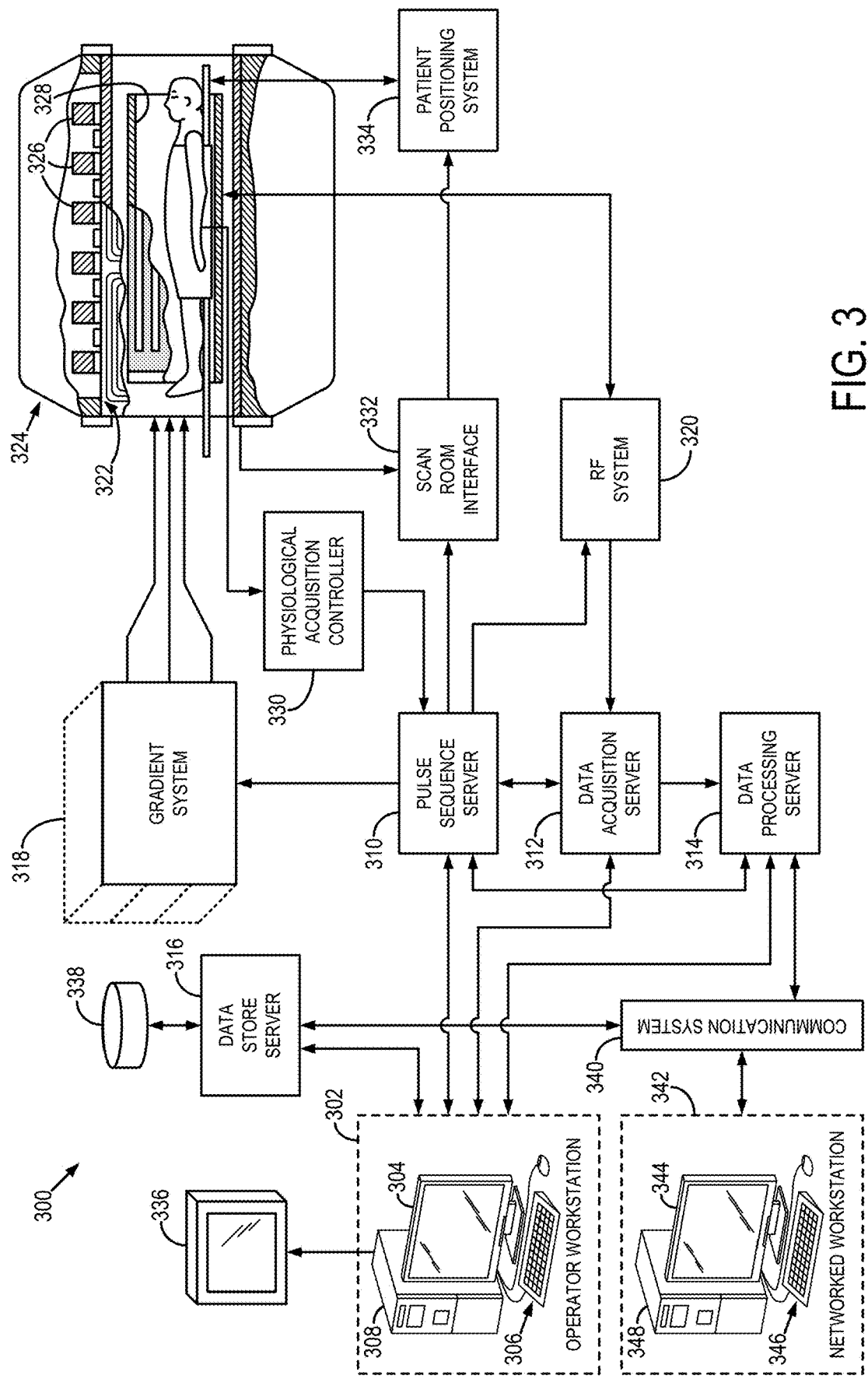
FIG. 3 is a block diagram of an example magnetic resonance imaging ("MRI") system that can implement methods described here.

Referring particularly now to FIG. 3, an example of a magnetic resonance imaging ("MR") or nuclear magnetic resonance (NMR) system 300 that can implement the methods described here is illustrated. The MR system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MR system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MR pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (5);$$

and the phase of the received magnetic resonance signal may also be determined according to the following relationship:

$$\varphi = \tan^{-1}\left(\frac{Q}{I}\right). \qquad (6)$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MR system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

The present disclosure has described one or more embodiments, and it should be appreciated that many equivalents, alternatives, variations, and modifications, aside from those expressly stated, are possible and within the scope of the invention.

The invention claimed is:

1. A method for using a magnetic resonance (MR) system to determine quantitative chemical exchange or exchangeable proton information from a subject, the steps of the method comprising:
   (a) directing the MR system to perform a pulse sequences block in which radio frequency (RF) energy is applied to the subject to substantially saturate magnetization corresponding to an exchangeable proton;
   (b) following step (a), acquiring data from the subject with the MR system;
   (c) repeating step (a) a plurality of times where parameters of the pulse sequence sub-blocks differ in at least some of the pulse sequence sub-blocks by at least an amount of RF energy applied to saturate the magnetization corresponding to the exchangeable proton;
   (d) after each repetition of step (a), repeating step (b) to acquire data representing signal evolutions from the subject;
   (e) comparing the signal evolutions with a dictionary database comprising a plurality of different signal evolution templates to determine quantitative chemical exchange or exchangeable proton information of the subject; and
   (f) generating a chemical exchange saturation transfer map using the quantitative chemical exchange or exchangeable proton information determined in step (e);
   wherein step (e) includes performing a pattern match of a measured trajectory in the signal evolutions with a pre-computed trajectory in the dictionary database to determine the quantitative chemical exchange or exchangeable proton information determined in step (e).

2. The method of claim 1 further comprising estimating optimized acquisition parameters for repetitions of the sub-block of step (a) that are optimized to direct the MR system to generate a plurality of different signal evolutions that maximize discrimination between longitudinal relaxation parameters in a minimized number of repetition time (TR) periods.

3. The method of claim 1 wherein step (c) further includes varying a repetition time associated with each sub-block.

4. The method of claim 1 wherein step (a) includes applying the RF energy applied to the subject to substantially saturate magnetization corresponding to the exchangeable proton at an offset from water.

5. The method of claim 4 wherein step (c) further includes holding the offset from water fixed at each repetition of step (a).

6. The method of claim 4 wherein step (c) further includes varying the offset from water for at least some repetitions of step (a).

7. The system comprising:
   a magnet system configured to generate a polarizing magnetic field about at least a portion of a subject arranged in the MR system;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array;
   a computer system programmed to:
      (a) control the magnetic gradient system and the RF system to perform a pulse sequences block in which radio frequency (RF) energy is applied to the subject to substantially saturate magnetization corresponding to an exchangeable proton;
(b) following step (a), control the magnetic gradient system and the RF system acquire data from the subject with the MR system;
(c) control the magnetic gradient system and the RF system to repeat step (a) a plurality of times where parameters of the pulse sequence sub-blocks differ in at least some of the pulse sequence sub-blocks by at least an amount of RF energy applied to saturate the magnetization corresponding to the exchangeable proton;
(d) after each repetition of step (a), control the magnetic gradient system and the RF system to repeat step (b) to acquire data representing signal evolutions from the subject;
(e) compare the signal evolutions with a dictionary database comprising a plurality of different signal evolution templates to determine quantitative chemical exchange or exchangeable proton information of the subject; and
(f) generate a chemical exchange saturation transfer map using the quantitative chemical exchange or exchangeable proton information determined in step (e);

wherein, to perform step (e), the computer system is further programmed to perform a pattern match of a measured trajectory in the signal evolutions with the pre-computed trajectory in the dictionary database to determine the quantitative chemical exchange or exchangeable proton information determined in step (e).

8. The system of claim 7 wherein the computer system is programmed to use a dot product when performing the pattern match.

9. The system of claim 7 wherein the computer system is programmed to use a subtraction of unnormalized trajectories when performing the pattern match.

* * * * *